(12) United States Patent
Suzuki et al.

(10) Patent No.: US 7,126,517 B2
(45) Date of Patent: Oct. 24, 2006

(54) DELTA-SIGMA MODULATOR AND DELTA-SIGMA MODULATION METHOD

(75) Inventors: Nobukazu Suzuki, Kanagawa (JP); Gen Ichimura, Tokyo (JP); Masayoshi Noguchi, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/151,359

(22) Filed: Jun. 14, 2005

(65) Prior Publication Data

US 2005/0285765 A1    Dec. 29, 2005

(30) Foreign Application Priority Data

Jun. 24, 2004   (JP)   ............................. 2004-186926
Jun. 7, 2005    (JP)   ............................. 2005-167317

(51) Int. Cl.
   *H03M 3/00* (2006.01)
(52) U.S. Cl. ..................................... 341/143; 341/155
(58) Field of Classification Search ................ 341/143, 341/144, 155, 131, 118, 120
   See application file for complete search history.

(56) References Cited

U.S. PATENT DOCUMENTS 5,793,316 A * 8/1998 Noguchi et al. .............. 341/77
6,462,685 B1 * 10/2002 Korkala ....................... 341/131
6,473,019 B1 * 10/2002 Ruha et al. .................. 341/143
6,515,601 B1 * 2/2003 Fukuhara et al. ............ 341/131
6,975,255 B1 * 12/2005 Zhang ......................... 341/131

* cited by examiner

*Primary Examiner*—Peguy JeanPierre
(74) *Attorney, Agent, or Firm*—Oblon, Spivk, McClelland, Maier & Neustadt, P.C.

(57) ABSTRACT

A delta-sigma modulator and delta-sigma modulation method according to the present invention are capable of ensuring a stable 1-bit signal having less distortion at the transition time from an audio signal reproduction state to soundless state while maintaining high sound quality during reproduction of an audio signal representing music or the like, and, at the same time, capable of maintaining high sound quality at the transition time from a soundless state to audio signal reproduction state. The delta-sigma modulator applies delta-sigma modulation to an input signal to output a 1-bit digital signal, and comprises an integration section that applies integration to the input signal, a quantization section that quantizes the integrated output from the integration section, a random noise generation section that generates a random noise signal whose gain has been adjusted based on the integrated output of the integration section, a detection section that detects a predetermined pattern from the input signal, and a changeover section that switches supply and suspension of supply of the random noise signal from the random noise generation section to the quantization section based on a detection result of the detection section.

17 Claims, 15 Drawing Sheets

| DSD 1-bit (binary value) | → | Multi-level |
|---|---|---|
| 1 | → | Positive maximum value |
| 0 | → | Negative maximum value |

FIG.10

Example of mute pattern detection procedure

DELTA-SIGMA MODULATOR AND DELTA-SIGMA MODULATION METHOD

BACKGROUND OF THE INVENTION

1. Field of the Invention

The present invention relates to a delta-sigma modulator and a delta-sigma modulation method that apply delta-sigma ($\Delta\Sigma$) modulation to an analog input signal or a digital input signal having a plurality of bits to generate a 1-bit digital signal.

2. Description of the Related Art

A $\Delta\Sigma$ modulated 1-bit audio signal has a format including a very high sampling frequency and a short data word length (for example, a sampling frequency of 64 times 44.1 kHz and a data word length of 1-bit) as compared with a format of data used in conventional digital audio (for example, a sampling frequency of 44.1 kHz and a data word length of 16 bits). The $\Delta\Sigma$ modulated 1-bit audio signal has an advantage of a wide transmissible frequency range. Even with the 1-bit signal, the $\Delta\Sigma$ modulation makes it possible to obtain a wide dynamic range in an audio range of low frequencies relative to the 64 times oversampling frequency. Taking advantage of this feature, the $\Delta\Sigma$ modulation can be applied to a recorder and data transmission for high-quality sound.

A $\Delta\Sigma$ modulation circuit itself is not an especially novel technique; the circuit is commonly used within a conventional A/D converter or the like, because the circuit configuration is suitable for integration into an IC and the circuit can achieve a high A/D conversion precision relatively easily. The $\Delta\Sigma$ modulated signal can be restored to an analog audio signal by passing the $\Delta\Sigma$ modulated signal through a simple analog low-pass filter.

Conventionally, in a $\Delta\Sigma$ modulator, when a signal with a certain constant frequency is input, the same signal is repeated within the $\Delta\Sigma$ modulator because the $\Delta\Sigma$ modulator has a feedback system, with the result that a distorted or unstable signal is output.

FIG. 1 shows a configuration of a conventionally-known $\Delta\Sigma$ modulator 100. The $\Delta\Sigma$ modulator 100 is a fifth-order $\Delta\Sigma$ modulator having five integrators 109, 111, 113, 115, and 117. Each of the integrators includes an adder and a delayer. For example, the integrator 109 includes an adder 109a and a delayer 109b.

An input signal input through an input terminal 101 is supplied to coefficient calculators 102, 103, 104, 105, 106, and 107 at a time. The coefficient calculators 102, 103, 104, 105, 106, and 107 are calculators for performing calculation control like gain control or filter control for an input signal and have feedforward coefficients ff0, ff1, ff2, ff3, ff4, and ff5, respectively.

The coefficient calculators 102, 103, 104, 105, and 106 perform calculation for the feedforward coefficients ff0, ff1, ff2, ff3, and ff4. The obtained respective calculation outputs are supplied to the adders 109a, 111a, 113a, 115a, and 117a of the integrators 109, 111, 113, 115, and 117. The coefficient calculator 107 performs calculation for the feedforward coefficient ff5. The obtained calculation output is supplied to the adder 118, and added to the integrated output of the integrator 117. The added output of the adder 118 is supplied to a quantizer 119.

The quantizer 119 applies quantization to the added output and supplies an output terminal 125 with the quantized output and, at the same time, feeds back the quantized output to coefficient calculators 120, 121, 122, 123 and 124 to be described later. The quantizer 119 generates a 1-bit output signal by applying quantization to the added output while referring to a threshold value of 0, which is constant at all times with respect to time. That is, the quantizer 119 applies quantization to the added output, which is an input signal, by determining two value levels using the threshold of 0, that is, determining whether the input signal is 0 or more, or less than 0.

The coefficient calculators 120, 121, 122, 123, and 124 hold feedback coefficients fb0, fb1, fb2, fb3, and fb4, used when the quantized output is fed back to the integrators 109, 111, 113, 115, and 117. The respective calculation outputs from the coefficient calculators 120, 121, 122, 123, and 124 are supplied to adders 108, 110, 112, 114, and 116, which are provided in front of the integrators 109, 111, 113, 115, and 117, and then fed back to the respective integrators.

In the case of, for example, attenuation control or gain control like fade-in or fade-out, the feedforward coefficients ff0, ff1, ff2, ff3, ff4, and ff5 of the coefficient calculators 102, 103, 104, 105, 106, and 107 are determined by a not-shown controller and the gain of input signals is controlled.

Further, in the case of filter control that passes or blocks only a desired frequency band, the feedforward coefficients ff0, ff1, ff2, ff3, ff4, and ff5 of the coefficient calculators 102, 103, 104, 105, 106, and 107, and the feedback coefficients fb0, fb1, fb2, fb3, and fb4 of the coefficient calculators 120, 121, 122, 123 and 124 are determined by the controller and input signals are subjected to filter control.

In the fifth-order $\Delta\Sigma$ modulator 100 shown in FIG. 1, when a signal with a constant repetition frequency, called a fixed pattern, is input, or when a 0 level signal is input at the time when the input of the $\Delta\Sigma$ modulator is opened, a distorted or unstable signal is output, because the $\Delta\Sigma$ modulator 100 has a configuration that feeds back a difference between the output of the integrator and the quantized value thereof.

FIG. 2 shows the frequency analysis result of a 1-bit output signal of 128 fs (fs=44.1 kHz) in the case where a signal of a fixed pattern is input. FIG. 3 shows the frequency analysis result of a 1-bit output signal of 128 fs (fs=44.1 kHz) in the case where a 0 level signal is input as an input signal. As can be seen from FIGS. 2 and 3, the configuration that feeds back a difference between the output of the integrator and the quantized value thereof when a signal of a certain fixed pattern or 0 level signal is input makes noise shaping, which is one of the features of the $\Delta\Sigma$ modulator, ineffective, with the result that a distorted or unstable signal is output.

To avoid this, in the conventional $\Delta\Sigma$ modulator, a random noise signal is input through the input side component of the $\Delta\Sigma$ modulator (for example, through the adder 108 in the case of the $\Delta\Sigma$ modulator 100 of FIG. 1). Alternatively, a random component is inserted at the front stage of the quantization performed in the $\Delta\Sigma$ modulator to eliminate the fixed pattern.

However, the insertion of a random component may degrade the signal characteristics. To cope with this problem, there is available a method that calculates an adequate amount of the random component and inputs it equivalently to the quantizer, as disclosed in Jpn. Pat. Appln. Laid-Open Publication No. 2002-314425 (Patent Application No. 2001-157947) by the present applicant. The delta-sigma modulator disclosed in Jpn. Pat. Appln. Laid-Open Publication No. 2002-314425 controls a threshold level to be referred to in quantization processing of the quantizer in a variable manner with respect to a time axis in order to input the calculated adequate amount of random component equivalently to the quantizer.

FIG. 4 shows a configuration example of the above mentioned delta-sigma modulator 130 according to Jpn. Pat. Appln. Laid-Open Publication No. 2002-314425 that uses the adequate amount of random component. The ΔΣ modulator 130 is a fifth-order ΔΣ modulator having five integrators 139, 141, 143, 145, and 147. Each of the integrators includes an adder and a delayer. For example, the integrator 139 includes an adder 139a and a delayer 139b.

In the delta-sigma modulator 130, a multi-channel audio signal represented by using a 1-bit audio data from CH 1 to CH 6 is reproduced from, for example, an optical disc 131 like a Super Audio CD (SA-CD) by a not-shown disc reproduction apparatus and supplied to coefficient calculators 132, 133, 134, 135, 136, and 137 at a time. The coefficient calculators 132, 133, 134, 135, 136, and 137 are calculators for performing calculation control like gain control, filter control, or mix control for the respective 6-channel multi-channel audio signals and have coefficients b0, b1, b2, b3, b4, and b5 for the respective calculation processes. In the case of the mix control, the coefficients b0, b1, b2, b3, b4, and b5 are determined by a controller to be described later and the respective multi-channel signals are mixed.

The coefficient calculators 132, 133, 134, 135, and 136 perform calculation for the coefficients b0, b1, b2, b3, and b4. The obtained respective calculation outputs are supplied to the adders 139a, 141a, 143a, 145a, and 147a of the integrators 139, 141, 143, 145, and 147. The coefficient calculator 137 performs calculation for the coefficient b5. The obtained calculation output is supplied to the adder 148, and added to the integrated output of the integrator 147. The added output of the adder 148 is supplied to an adder 149 provided in front of a quantizer 150.

Further, a random noise signal is supplied to the adder 149. The random noise signal has been set in an adequate amount by a random noise generator 152 that generates a random noise signal like a dither signal. Thus, the adder 149 adds an adequate amount of the random noise signal to the added output of the adder 148 and supplies the quantizer 150 with the added output including the random noise signal.

The random noise signal generator 152 supplies the quantizer 150 with the random noise signal whose gain has been set in an adequate amount based on the integrated output of the last stage integrator 147 through the adder 149. That is, a gain calculator 151 calculates the gain based on the integrated output of the last stage integrator 147 and sets in the random noise generator 152.

The gain calculator 151 calculates a gain by which a random noise signal Rn is multiplied such that the absolute value of the random noise signal Rn becomes less than or equal to a variable threshold Δq ($|Rn| \leq \Delta q$) which is based on the amplitude of the signal inside the last stage integrator 147.

The adder 149 adds the random noise signal Rn whose gain has been adjusted as described above to the integrated output of the last stage integrator 147 and, the quantizer 150 quantizes the added output signal.

The adequate amount of gain that has been calculated by the gain calculator 151 is equal to the threshold ±Δq of the quantizer, the threshold being variable with respect to time. The variable threshold Δq is calculated based on the amplitude of the signal generated in the last stage integrator 147. More concretely, the variable threshold Δq is obtained as SαDend which is calculated by multiplying the maximum value Dend of the amplitude of the signal generated in the last stage integrator 147 by a predetermined constant Sα.

FIG. 5 shows a conceptual view of a quantizer using the threshold variable with respect to time. The adequate amount of ±Δq is, for example, not more than 75 with respect to ±1.0 of the quantizer. When an amount that exceeds that value is input, delta-sigma modulation becomes unstable, making it impossible to suppress distortion.

The quantizer 150 applies quantization to the added output to which the adequate amount of random noise signal has been added and supplies an output terminal 159 with the quantized output as well as feeds back the quantized output to coefficient calculators 153, 154, 155, 156, and 157 to be described later.

The coefficient calculators 153, 154, 155, 156, and 157 hold feedback coefficients a0, a1, a2, a3, and a4, used when the quantized output is fed back to the integrators 139, 141, 143, 145, and 147. The respective calculation outputs from the coefficient calculators 153, 154, 155, 156, and 157 are supplied to adders 138, 140, 142, 144, and 146, which are provided in front of the integrators 139, 141, 143, 145, and 147, and then fed back to the respective integrators. The ΔΣ modulator 130 of FIG. 4 having the configuration described above can apply quantization to an input signal at an optimal variable threshold level.

SUMMARY OF THE INVENTION

In the ΔΣ modulator 130 shown in FIG. 4, the adequate amount of random component calculated by the gain calculator 151 is input to a quantizer equivalently not only during soundless state in which an input signal becomes a fixed pattern or 0 level for a predetermined time, but also during reproduction of an audio signal representing music or the like. Since the random component is added during reproduction of an audio signal representing music or the like, high sound quality cannot necessarily be maintained, while it is possible to ensure a stable 1-bit signal having less distortion in the soundless state.

The present invention has been made in view of the above situation, and it is desirable to provide a delta-sigma modulator and a delta-sigma modulation method capable of maintaining high sound quality during reproduction of an audio signal representing music or the like and ensuring a stable 1-bit signal having less distortion at the transition time from an audio signal reproduction state to soundless state, and, at the same time, capable of maintaining high sound quality at the transition time from a soundless state to audio signal reproduction state.

To solve the above problem, according to the present invention, there is provided a delta-sigma modulator which applies delta-sigma modulation to an input signal to output a 1-bit digital signal, comprising: an integration means for applying integration to the input signal; a quantization means for quantizing the integrated output from the integration means; a random noise generation means for generating a random noise signal whose gain has been adjusted based on the integrated output of the integration means; a detection means for detecting a predetermined pattern from the input signal; and a changeover means for switching supply and suspension of supply of the random noise signal from the random noise generation means to the quantization means based on a detection result of the detection means.

The changeover means supplies the random noise signal generated by the random noise generation means to the quantization means when the detection means detects a fixed pattern representing a mute pattern or 0 level that continues for a predetermined time period as the predetermined pattern; whereas the changeover means suspends the supply when the detection means does not detect the predetermined pattern.

To solve the above problem, according to the present invention, there is provided a delta-sigma modulator which applies delta-sigma modulation to an input signal to output a 1-bit digital signal, comprising: an integration means for applying integration to the input signal; a quantization means for quantizing the integrated output from the integration means; a detection means for detecting a predetermined pattern from the input signal; and a control means for dynamically controlling a threshold value for the quantization performed by the quantization means based on a detection result of the detection means.

The delta-sigma modulator further comprises a random noise generation means for generating a random noise signal whose gain has been adjusted based on the integrated output of the integration means. Therefore, the control means controls the gain to be supplied to the random noise generation means in an equivalent manner to variable control of the threshold level referred to in the quantization performed by the quantization means with respect to time axis when the detection means detects a fixed pattern representing a mute pattern or 0 level that continues for a predetermined time period as the predetermined pattern; whereas the control means sets the gain to 0 when the detection means does not detect the predetermined pattern.

To solve the above problem, according to the present invention, there is provided a delta-sigma modulation method which applies delta-sigma modulation to an input signal to output a 1-bit digital signal, comprising: an integration step of applying integration to the input signal; a quantization step of quantizing the integrated output from the integration step; a random noise generation step of generating a random noise signal whose gain has been adjusted based on the integrated output of the integration step; a detection step of detecting a predetermined pattern from the input signal; and a changeover step of switching supply and suspension of supply of the random noise signal from the random noise generation step to the quantization step based on a detection result of the detection step.

The changeover step supplies the random noise signal generated by the random noise generation step to the quantization step when the detection step detects a fixed pattern representing a mute pattern or 0 level that continues for a predetermined time period as the predetermined pattern; whereas the changeover step suspends the supply when the detection step does not detect the predetermined pattern.

To solve the above problem, according to the present invention, there is provided a delta-sigma modulation method which applies delta-sigma modulation to an input signal to output a 1-bit digital signal, comprising: an integration step of applying integration to the input signal; a quantization step of quantizing the integrated output from the integration means; a detection step of detecting a predetermined pattern from the input signal; and a control step of controlling a threshold value for the quantization performed by the quantization step based on a detection result of the detection step.

The delta-sigma modulation method further comprises a random noise generation step of generating a random noise signal whose gain has been adjusted based on the integrated output of the integration step. Therefore, the control step controls the gain to be supplied to the random noise generation step in an equivalent manner to variable control of the threshold level referred to in the quantization performed by the quantization step with respect to time axis when the detection step detects a fixed pattern representing a mute pattern or 0 level that continues for a predetermined time period as the predetermined pattern; whereas the control step sets the gain to 0 when the detection step does not detect the predetermined pattern.

BRIEF DESCRIPTION OF THE DRAWINGS

FIG. 10 is a comparison table between the DSD 1-bit and a multi level;

DETAILED DESCRIPTION OF THE PREFERRED EMBODIMENTS

Figure 6:
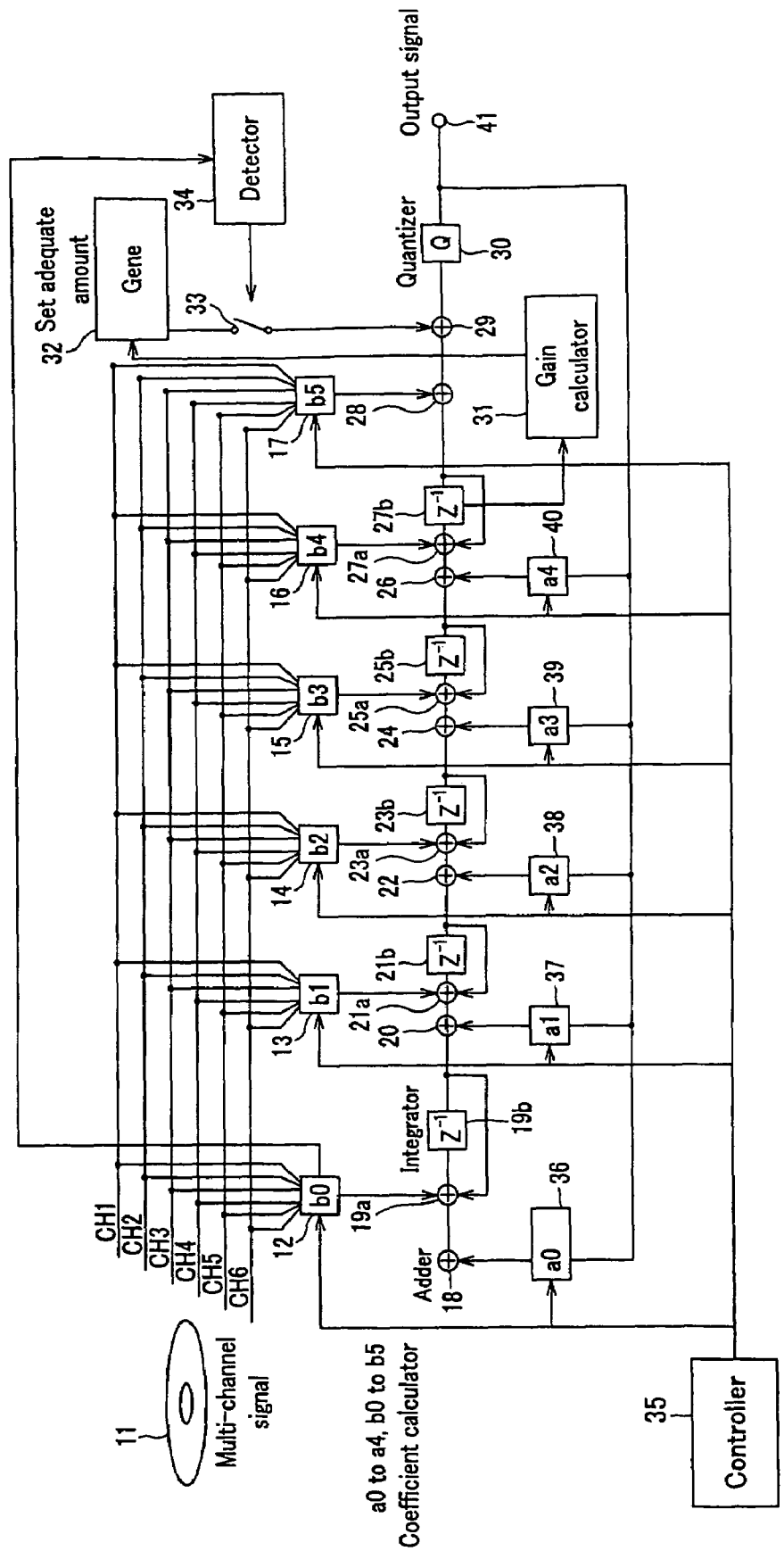
FIG. 6 is a configuration diagram of a ΔΣ modulator according to an embodiment of the present invention.

Embodiments of the present invention will be described below with reference to the accompanying drawings. A delta-sigma modulator 10 according to the present embodiment applies a delta-sigma modulation to an input signal to output a 1-bit digital signal. As shown in FIG. 6, the delta-sigma modulator 10 includes: an integration section having five integrators 19, 21, 23, 25, and 27 to be described later; a quantizer 30 that quantizes the integrated output from the integration section; a random noise generator 32 that generates a random noise signal whose gain has been adjusted by a gain calculator 31 based on the integrated output from the integration section; a detector 34 that detects, as a predetermined pattern, a fixed pattern representing a mute pattern and a 0 level that continues for a predetermined time from an input signal; a changeover switch 33 that switches supply and suspension of supply of the random noise signal from the random noise generator 32 to the quantizer 30.

The changeover switch 33 supplies the random noise signal generated by the random noise generator 32 to the quantizer 30 when the detector 34 detects the predetermined pattern; whereas the changeover switch 33 suspends the supply when the detector 34 does not detect the predetermined pattern.

Details of the configuration of the $\Delta\Sigma$ modulator 10 will be described below. In FIG. 6, the five integrators 19, 21, 23, 25, and 27 are constituted by adders 19a, 21a, 23a, 25a, and 27a and delayers 19b, 21b, 23b, 25b, and 27b, respectively.

A multi-channel audio signal represented by 1-bit audio data from CH1 to CH6 is input to the $\Delta\Sigma$ modulator 10. The multi-channel audio signal from CH1 to CH6 is reproduced from, for example, an optical disc 11 like a Super Audio CD (SA-CD) by a not-shown disc reproduction apparatus and supplied to coefficient calculators 12, 13, 14, 15, 16, and 17 at a time.

The coefficient calculators 12, 13, 14, 15, 16, and 17 are calculators for performing calculation control like gain control, filter control, or mix control for the respective 6-channel multi-channel audio signals and have coefficients b0, b1, b2, b3, b4, and b5 for the respective calculation processes. In the case of the mix control, for example, the coefficients b0, b1, b2, b3, b4, and b5 are determined by a controller 35 to be described later and the respective multi-channel signals are mixed.

The coefficient calculators 12, 13, 14, 15, and 16 perform calculation for the coefficients b0, b1, b2, b3, and b4. The obtained respective calculation outputs are supplied to the adders 19a, 21a, 23a, 25a, and 27a of the integrators 19, 21, 23, 25, and 27. The coefficient calculator 17 performs calculation for the coefficient b5. The obtained calculation output is supplied to the adder 28, and added to the integrated output of the integrator 27. The added output of the adder 28 is supplied to an adder 29 provided in front stage of a quantizer 30.

Also supplied to the adder 129 are the random noise signal from the random noise generator 32, such as a dither signal whose gain has been adjusted in an adequate amount, a pink noise signal, or a noise signal in which a high frequency component has been cut. Thus, the adder 29 adds the random noise signal whose gain has been adjusted in an adequate amount to the added output of the adder 28 and supplies the quantizer 30 with the added output including the random noise signal.

The random noise signal generator 32 supplies the quantizer 30 with the random noise signal whose gain has been adjusted in an adequate amount based on the integrated output of the last stage integrator 27 of the five integrators through the adder 29. That is, a gain calculator 31 adjusts the gain based on the integrated output of the last stage integrator 27 and sets the adjusted gain in the random noise generator 32.

The gain calculator 31 calculates a gain by which a dither signal Rn is multiplied such that the absolute value of the random noise signal Rn becomes less than or equal to a variable threshold $\Delta q$ ($|Rn| \leq \Delta q$) which is based on the amplitude of the signal inside the last stage integrator 27.

The adder 29 adds the random noise signal Rn whose gain has been adjusted as described above to the integrated output of the last stage integrator 27 and, the quantizer 30 quantizes the added output signal of the adder 29.

The dither signal, whose gain has been adjusted in an adequate amount, which has been calculated by the gain calculator 31 is equal to the threshold $\pm\Delta q$ of the quantizer, the threshold being variable with respect to time. The variable threshold $\Delta q$ is calculated based on the amplitude of the signal generated in the last stage integrator 27. More concretely, the variable threshold $\Delta q$ is obtained as S$\alpha$Dend which is calculated by multiplying the maximum value Dend of the amplitude of the signal generated in the last stage integrator 27 by a predetermined constant S$\alpha$.

Figure 1:
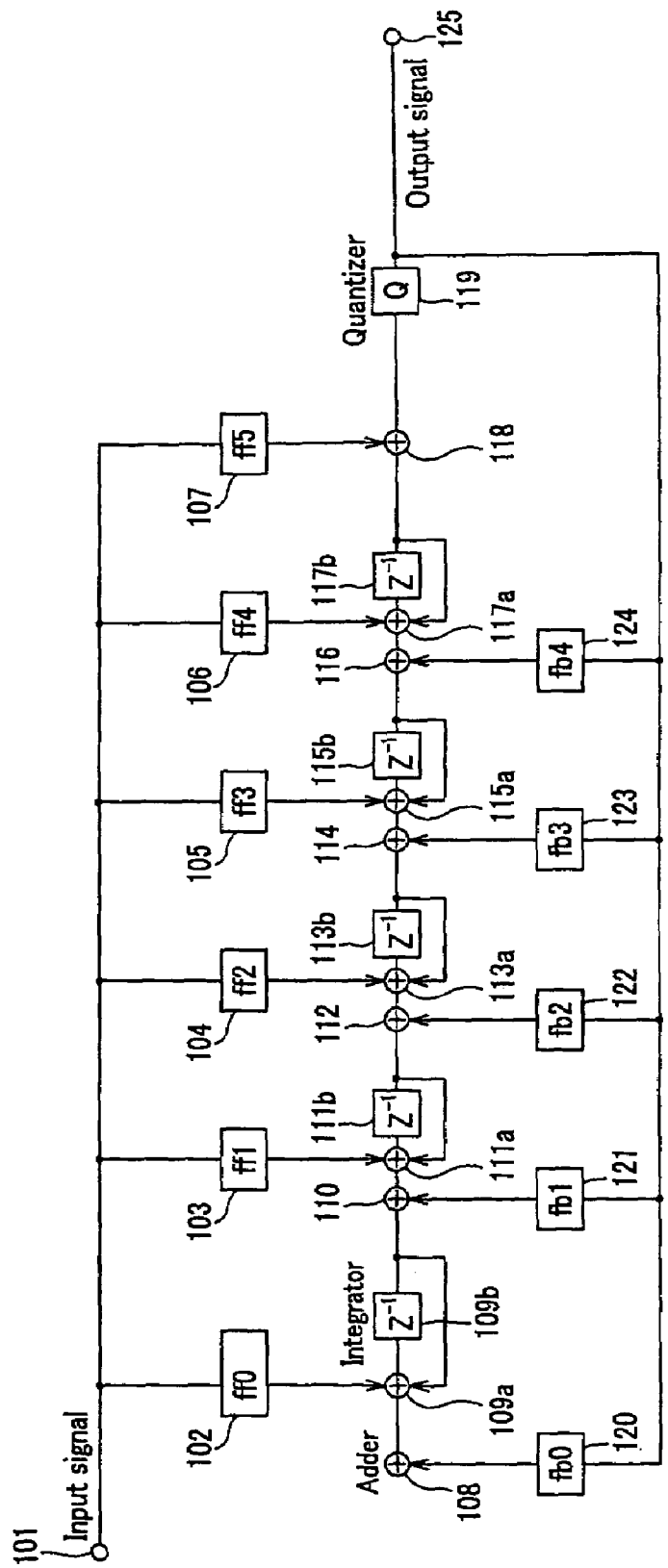
FIG. 1 is a view showing a configuration of a conventionally-known ΔΣ modulator.
Figure 2:
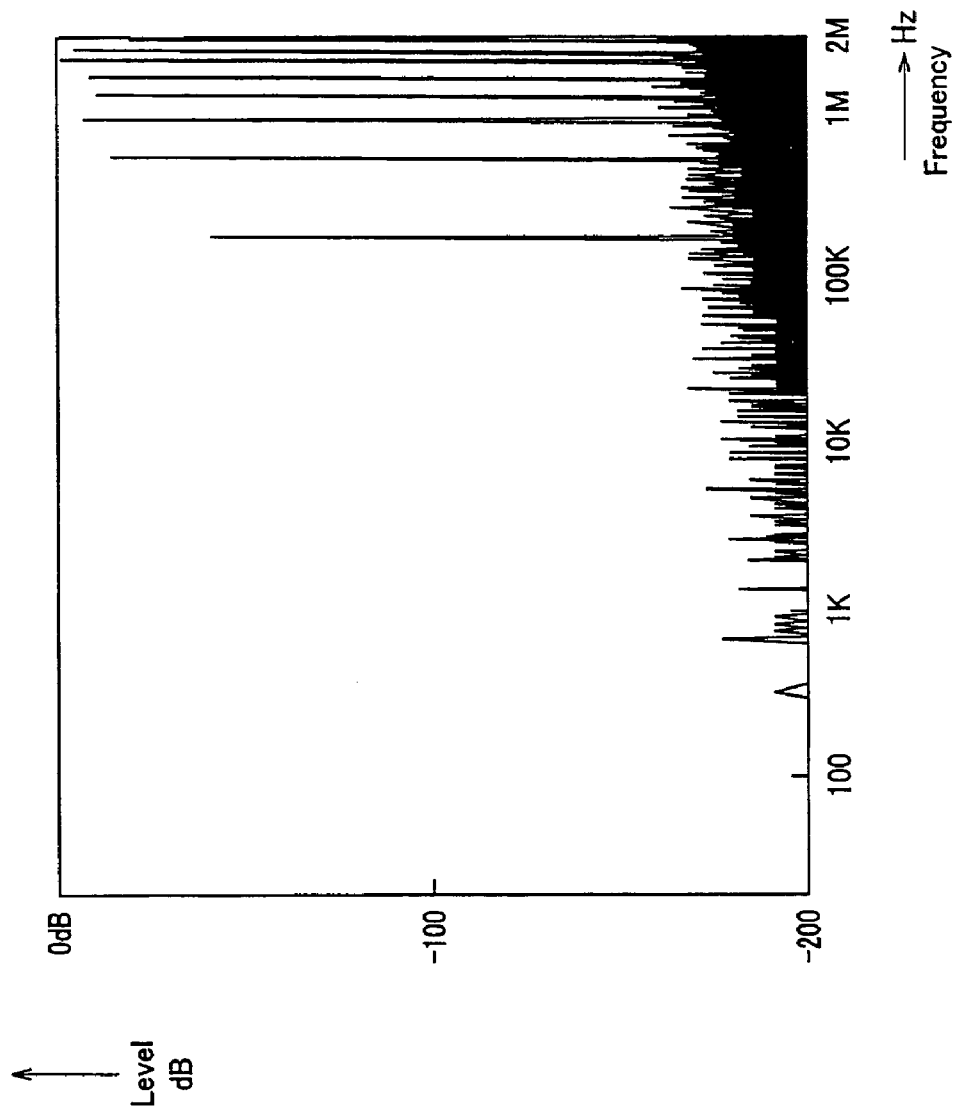
FIG. 2 is a spectrum diagram showing the frequency analysis result of a 1-bit output signal in the case where a signal of a fixed pattern is input in the conventional ΔΣ modulator.
Figure 3:
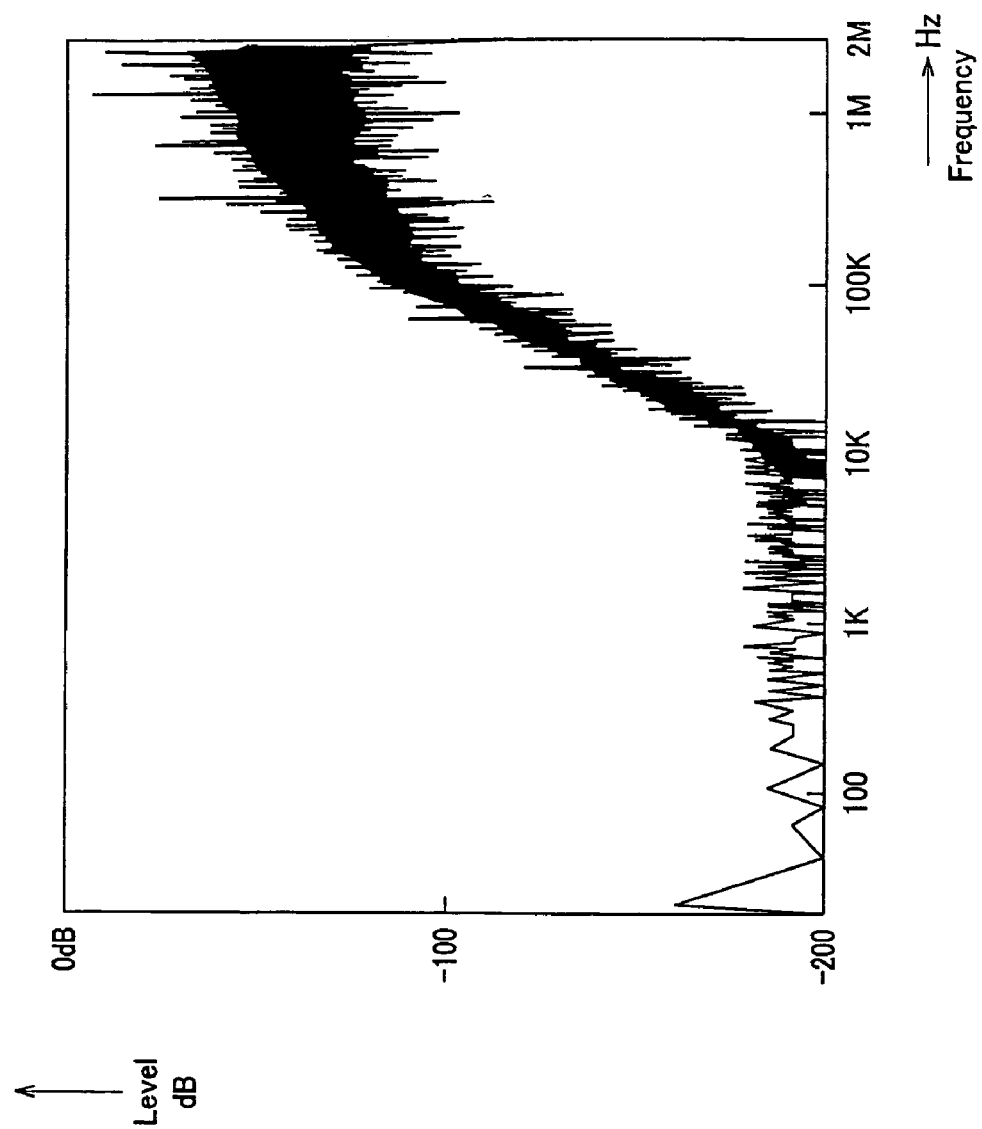
FIG. 3 is a spectrum diagram showing the frequency analysis result of a 1-bit output signal in the case where a 0 level signal is input in the conventional ΔΣ modulator.
Figure 4:
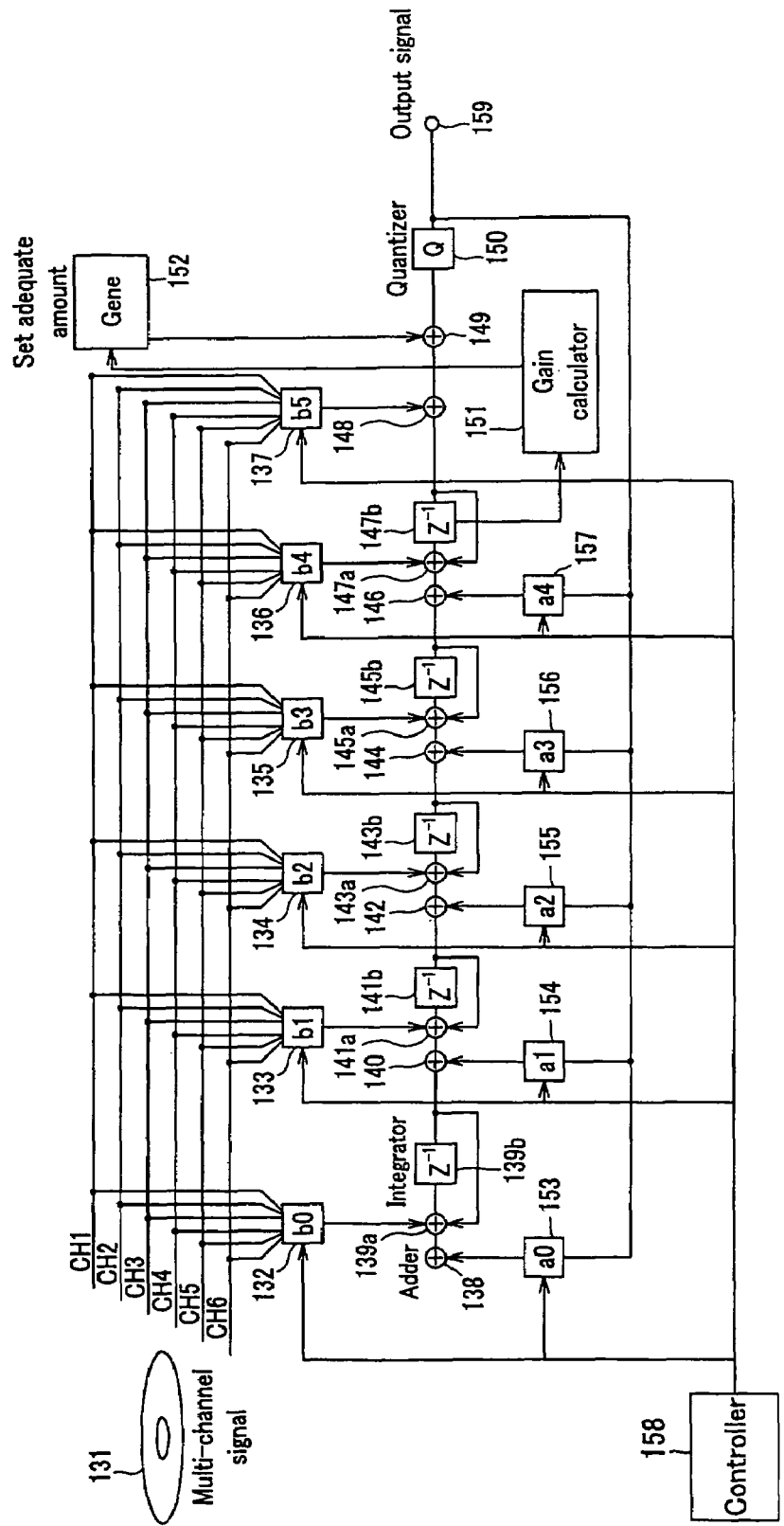
FIG. 4 shows a configuration example of a delta-sigma modulator using the adequate amount of random component, which is disclosed in Jpn. Pat. Appln. Laid-Open Publication No. 2002-314425.
Figure 5:
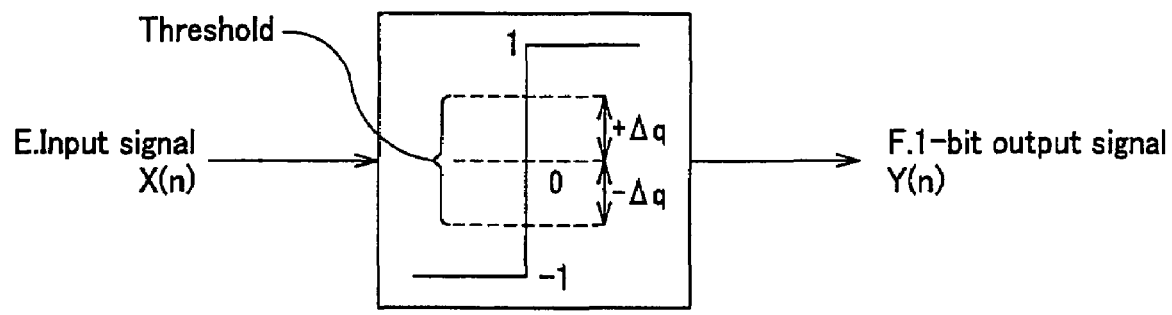
FIG. 5 shows a conceptual view of a quantizer using the threshold variable with respect to time.

As similar to the case of FIG. 5, the adequate amount of $\pm\Delta q$ is, for example, not more than 75 with respect to $\pm 1.0$ of the quantizer. When an amount that exceeds that value is input, delta-sigma modulation becomes unstable, making it impossible to suppress distortion.

Here, the $\Delta\Sigma$ modulator 10 controls the ON and OFF of the changeover switch 33 for supplying the quantizer 30 with the random noise signal Rn that has been adjusted in an adequate amount by the random signal generator 32. Only when the signal of a fixed pattern like a mute pattern that causes soundless state, or 0 level signal that continues for a predetermined period is input, the changeover switch is turned ON to supply the quantizer 30 with the random noise signal Rn. To realize this configuration, the detector 34 detects the fixed pattern and 0 level that continues for a predetermined time from the output of the coefficient calculator 12 and controls the ON and OFF of the changeover switch 33 based on the detection result.

The changeover switch 33 supplies the adequate amount of random noise signal Rn that has been generated by the random signal generator 32 to the adder 29 or suspends the supply based on the detection result. Therefore, turning on the changeover switch 33 only when the detector 34 detects the fixed pattern or 0 level allows the random noise signal Rn to be supplied to the quantizer 30 only when the signal of a fixed pattern or 0 level signal that continues for a predetermined time is input. When the input signal is not the signal of a fixed pattern or 0 level signal that continues for a predetermined time, that is, during reproduction of the audio signal representing music or the like, the random noise signal Rn is not supplied to the quantizer 30.

The quantizer 30 applies quantization to the input to which the a random noise signal Rn has been added or not and supplies an output terminal 41 with the quantized output as well as feeds back the quantized output to coefficient calculators 36, 37, 38, 39, and 40.

The coefficient calculators 36, 37, 38, 39, and 40 hold feedback coefficients a0, a1, a2, a3, and a4, used when the quantized output is fed back to the integrators 19, 21, 23, 25, and 27. The respective calculation outputs from the coefficient calculators 36, 37, 38, 39, and 40 are supplied to adders 18, 20, 22, 24, and 26, which are provided in front of the integrators 19, 21, 23, 25, and 27, and then fed back to the respective integrators.

The principle of a 0 level detection in the detector 34 at the time when the mix control is performed for a multi-channel signal reproduced from the optical disc 11 by using the coefficient calculators 12, 13, 14, 15, and 16 and coefficient calculators 36, 37, 38, 39, and 40, will next be described with reference to FIGS. 7 and 8.

Figure 7:
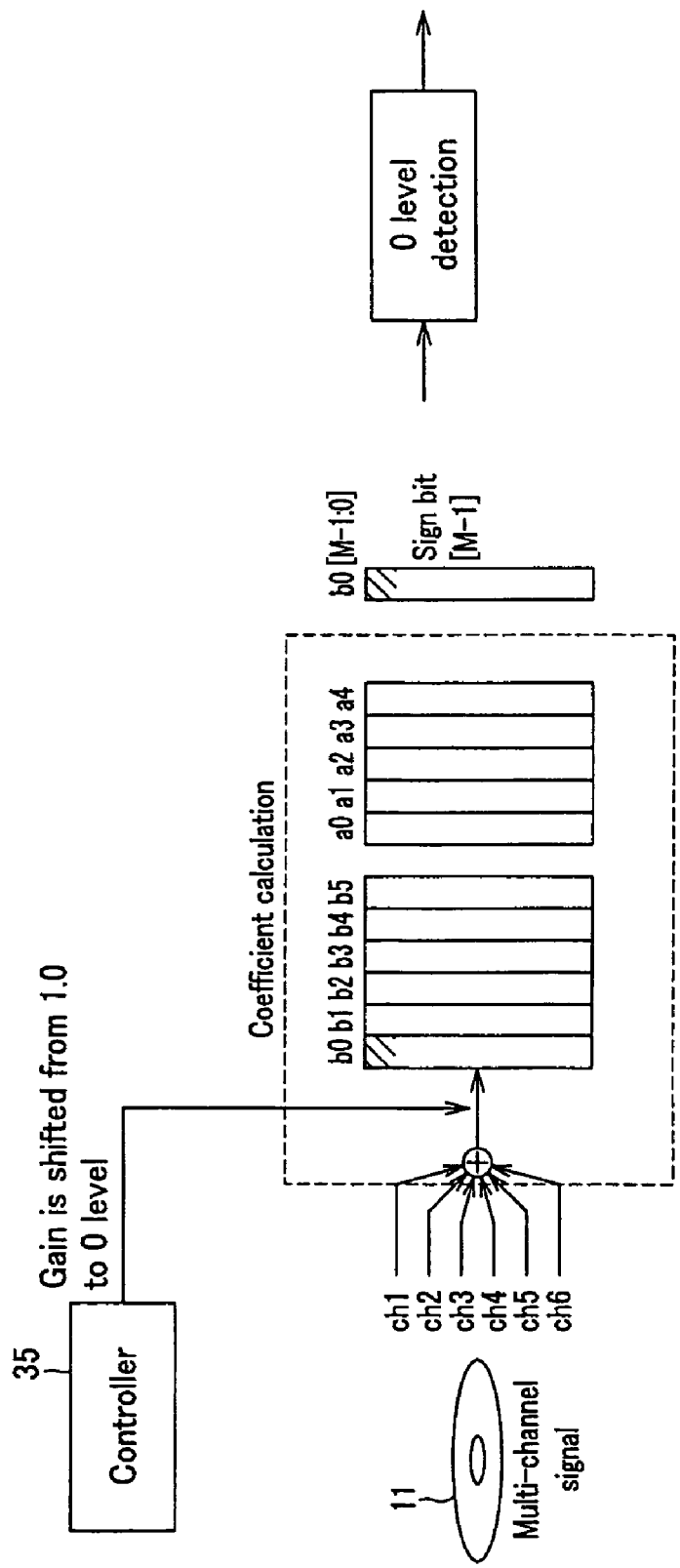
FIG. 7 is a view for explaining a 0 level detection principle of a detector constituting the ΔΣ modulator.

FIG. 7 is a view for explaining how the detector 34 detects the 0 level when the controller 35 instructs the coefficient calculators 12 to 17 and coefficient calculators 36 to 40 to perform gain control, and the gain is shifted from 1.0 to 0 level.

When the controller 35 instructs the coefficient calculators 12 to 17 to perform gain control, the coefficient calculators 12 to 17 determine the coefficients b0 to b5. The gain control is applied to the coefficients b0 to b5 equally, so that it is sufficient for the detector 34 to detect only one coefficient among the coefficients b0 to b5. In the configuration shown in FIG. 6, the detector 34 monitors the coefficient b0 of the coefficient calculator 12. In the case where the gain is shifted from 1.0 to 0 level based on the instruction from the controller 35, it is possible for the detector 34 to determine whether the level is 0 or not only by detecting the sign bit (highest order bit) of b0[M-1:0] (coefficient word length is M bit).

Figure 8:
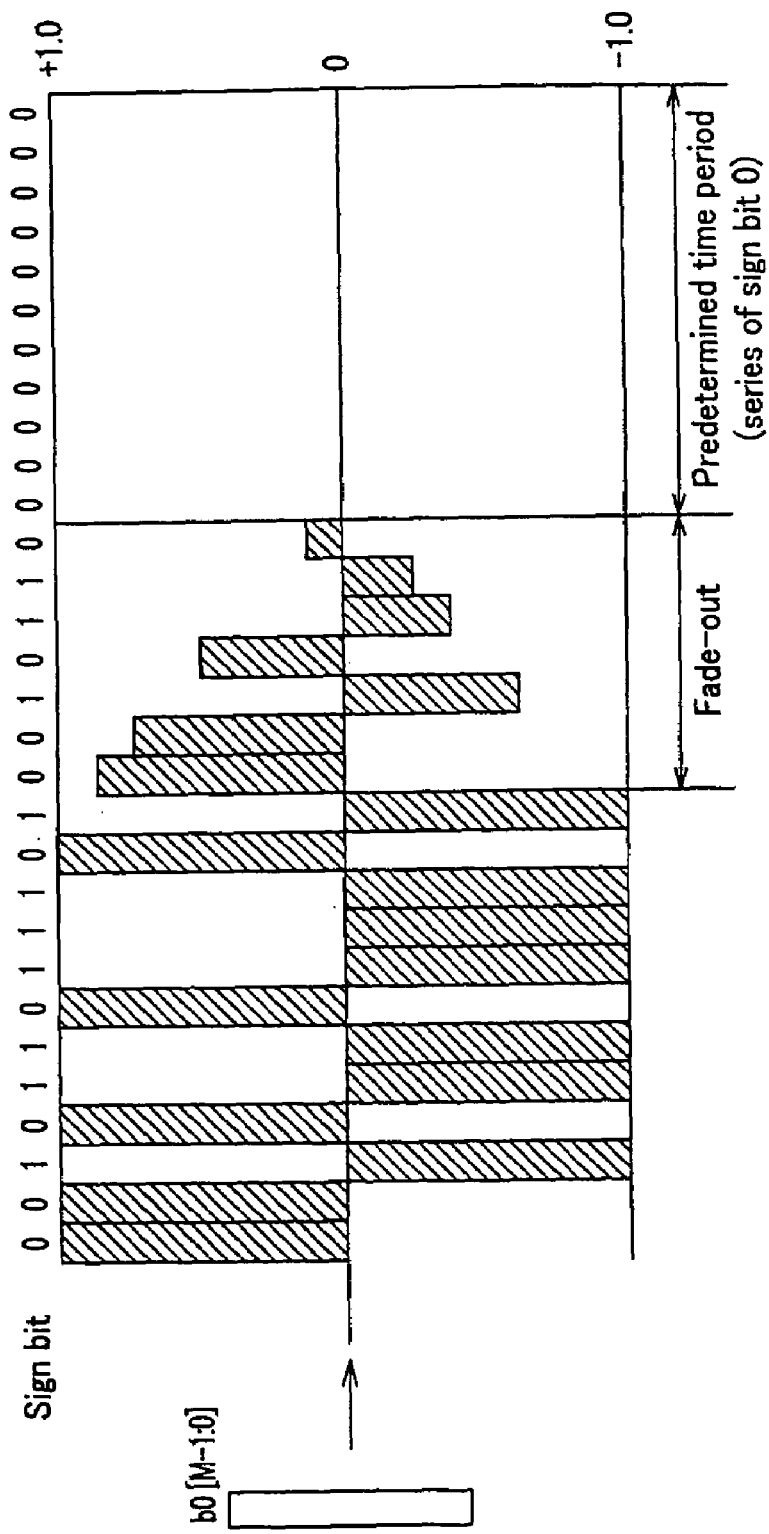
FIG. 8 is a view showing a change in the sign bit of one coefficient calculator.

FIG. 8 shows a change in the sign bit of the coefficient b0 of the coefficient calculator 12 when the controller 35 instructs the coefficient calculators 12 to 17 to perform gain control for fade-out. When the fade-out zone is ended, the sign bit (highest order bit) of b0[M-1:0] (coefficient word length is M bit) becomes "0" for a predetermined time period. When the detector 34 detects that the predetermined time period of "0" continues for, for example, 100 to 500 msec, it is possible to determine that the output level has been shifted from 1.0 to 0 level and the 0 level which is not audio signal representing music or the like continues. The predetermined time to continue may be set to 100 msec, 200 msec, 300 msec, or 400 msec, as long as it falls within a range of 100 to 500 msec. Further, it may be set to a range of 100 to 200, 300, or 400 msec, a range of 200 to 300, 400, or 500 msec, or a range of 300 to 400, or 500 msec.

Figure 9:
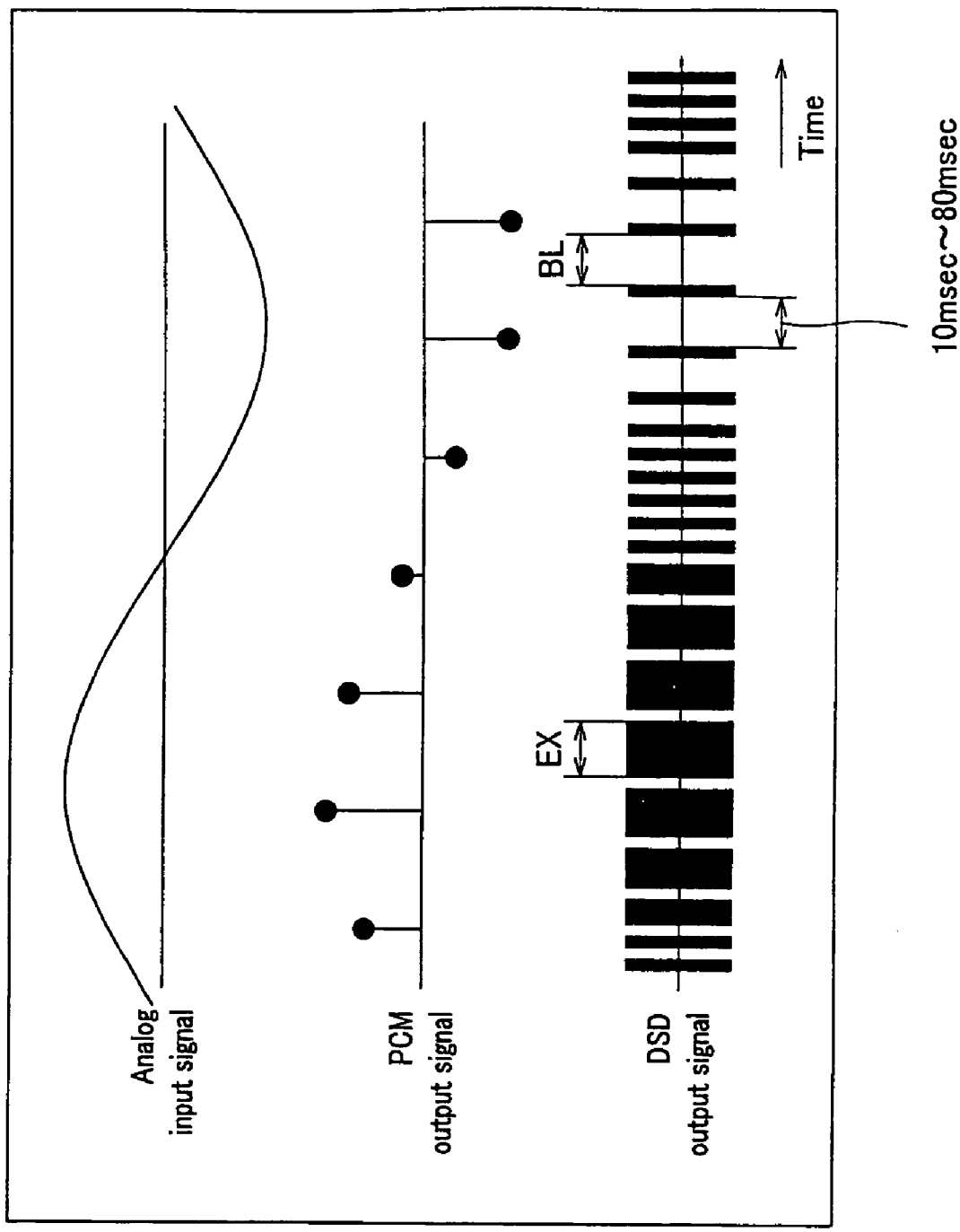
FIGS. 9A to 9C show audio signals representing music, including a DSD 1-bit signal.

Unlike the analog input signal waveform of FIG. 9A and PCM waveform of FIG. 9B, the audio signal of music or the like according to DSD (Direct Stream Digital) shown in FIG. 9C represents the magnitude of the audio signal by the density of digital pulse streams. The time periods where "1" continues, for example, the time periods EX in the DSD output signal shown in FIG. 9C exist intermittently in time direction. The silent parts where the amplitude is "0", which exist intermittently between the respective time periods EX as white areas, for example, the time periods BL are the time periods where "0" continues.

The code "0" in FIG. 8 is the sign code in the multi-bit. The 0 code means positive number or silent (0 level) in the signal waveform. On the other hand, assuming that the code "0" means "0" of DSD 1-bit, it becomes the negative maximum value, as can be seen from the table shown in FIG. 10. What is important is that in the case of DSD 1-bit, the intermediate value, that is, 0 value, does not exist. Therefore, when an audio signal is represented by a binary value like the DSD 1-bit, a signal pattern containing the same number of "1s" or "0s", such as "10010110 . . ." or "10101010 . . ." becomes a silent signal. When "0" of DSD 1-bit continues in a signal, which means the series of negative maximum signal, the signal approximates the negative maximum level without end.

In the case of an audio signal representing music or the like, the duration of a part where "0" continues is about 10 to 80 msec. Therefore, when the detector 34 monitors the coefficient b0 of the coefficient calculator 12 and thereby detects that the "0" sign bit continues for a predetermined time period longer than the time period during which "0" continues in the case of the audio signal, it can be determined that 0 level of the signal other than the audio signal representing music or the like continues.

As described above, in the case of the configuration shown in FIG. 6, it is not necessary to detect the sign bit of all input calculation coefficients b0 to b5. For example, only b0[M-1] bit is detected to determine whether the "0" sign bit continues for a predetermined time, so that it is possible to reduce the circuit scale. As a matter of course, the detector 34 may monitor the coefficients of the other coefficient calculators 13, 14, 15, 16, and 17.

Figure 11:
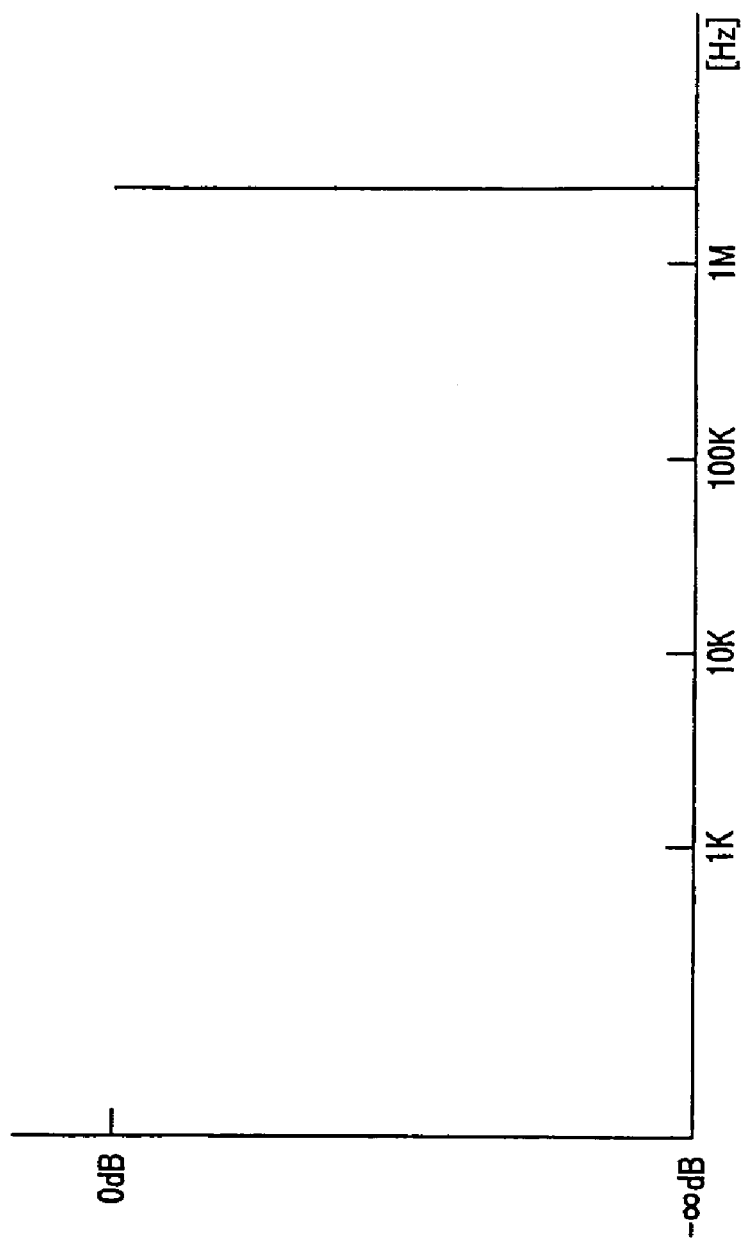
FIG. 11 is a spectrum diagram of a mute pattern signal.

Similarly, in the case of the fixed pattern detection, it is only necessary to determine whether the output after coefficient calculation is a fixed pattern. The fixed pattern in this case is a pattern containing the same number of "1s" and "0s", such as "10010110 . . ." or "10101010" represented by a binary value like the DSD 1-bit. When the pattern "10010110 . . ." is represented by hexadecimal number, a repetition of 9 (=1001) and 6 (=0110) is obtained. In the signal including a pulse train containing the same number of "0s" or "1s" per number of units and a repetition of the same pattern, as shown in FIG. 11, only one or two spectrum rises at, for example, frequency band more than several hundreds kHz and the level becomes -∞dB in theory at frequency band lower than this. The signal as described above is referred to as a mute pattern.

Figure 12:
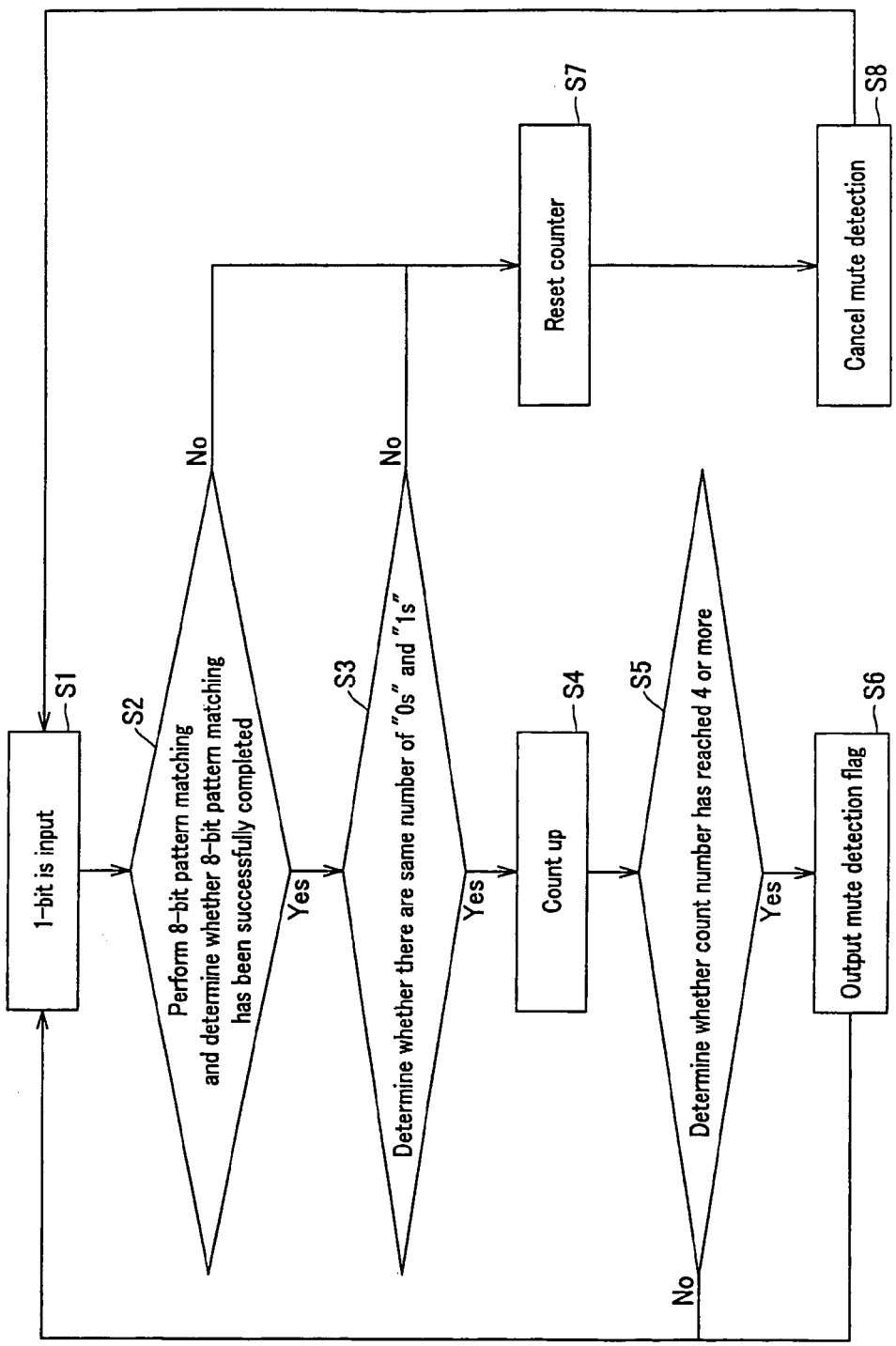
FIG. 12 is a flowchart showing a procedure for detecting the mute pattern signal.

In order to detect the mute pattern, the detector 34 operates in the ΔΣ modulator 10 shown in FIG. 6 according to the procedure of FIG. 12. In this case, the detector 34 includes two 8-bit registers and a counter.

The detector 34 monitors the coefficient b0 of the coefficient calculator 12. When a 1-bit signal is input in step S1, the detector 34 uses the two 8-bit registers to perform 8-bit pattern matching between the currently input 8-bit and previously input 8-bit and checks whether the matching has been successfully completed in step S2. When determining that the 8-bit pattern matching has been successfully completed (YES), the detector 34 advances to step S3 and checks whether there are the same number of "0s" and "1s". When determining that there are the same number of "0s" and "1s" (YES), the detector 34 advances to step S4 and counts up the counter value. The detector 34 then checks whether the count number has reached 4 or more in step S5. When determining that the count number has reached 4 or more (Yes), it can be determined that the detector 34 detects that, for example, "10010110" has repeated 4 times. In this case, the detector 34 outputs a mute detection flag, and turns ON the changeover switch 33 in step S6.

When determining that the 8-bit pattern matching has not been successfully completed (NO) in step S2, or determining that there are different number of "0s" and "1s" (NO) in step S3, the detector 34 resets the counter in step S7 and cancels the mute detection process in step S8. When determining that the count number has not reached 4 in step 5, the detector 34 repeats the processes starting from step S1.

Thus, it is only necessary for the detector 34 to determine whether the output after the coefficient calculation is a fixed pattern even when a fixed pattern like the mute pattern has been input.

Figure 13:
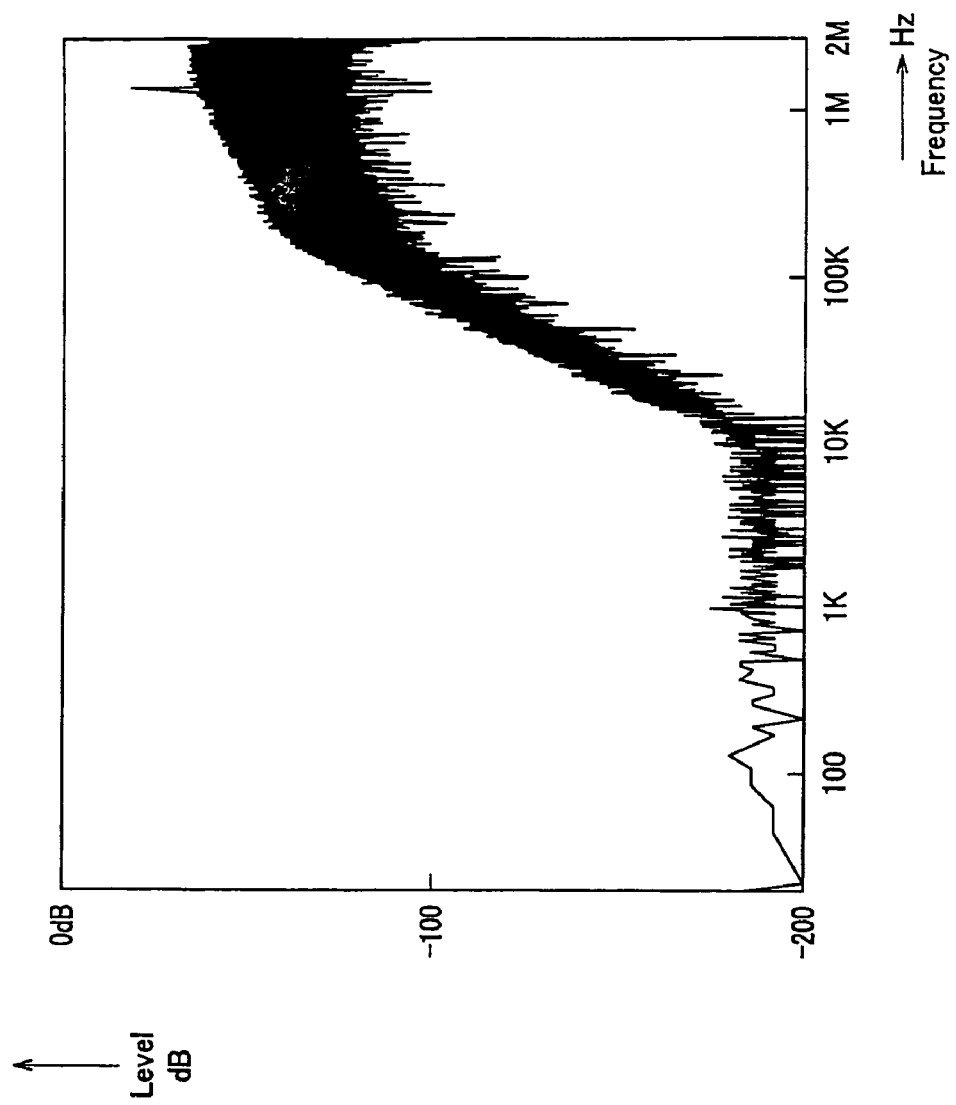
FIG. 13 is a spectrum diagram showing the frequency analysis result of an output signal with a sampling frequency of 128 fs (fs=44.1 kHz) and a data word length of 1-bit in the case where a 0 level signal is input.

As described above, the ΔΣ modulator 10 inputs the random noise signal to the quantizer 30 when the gain is set to 0 level during reproduction of an audio signal representing music or the like; whereas the ΔΣ modulator 10 does not input the random noise signal to the quantizer 30 during reproduction of an audio signal representing music or the like. FIG. 13 is a spectrum diagram showing the frequency analysis result of an output signal with a sampling frequency of 128 fs (fs=44.1 kHz) and a data word length of 1 bit in the case where the gain is set to 0 level, that is, a 0 level signal is input. As can be seen from FIG. 13, it is possible to ensure a stable 1-bit signal having less distortion and to apply noise shaping normally.

Figure 14:
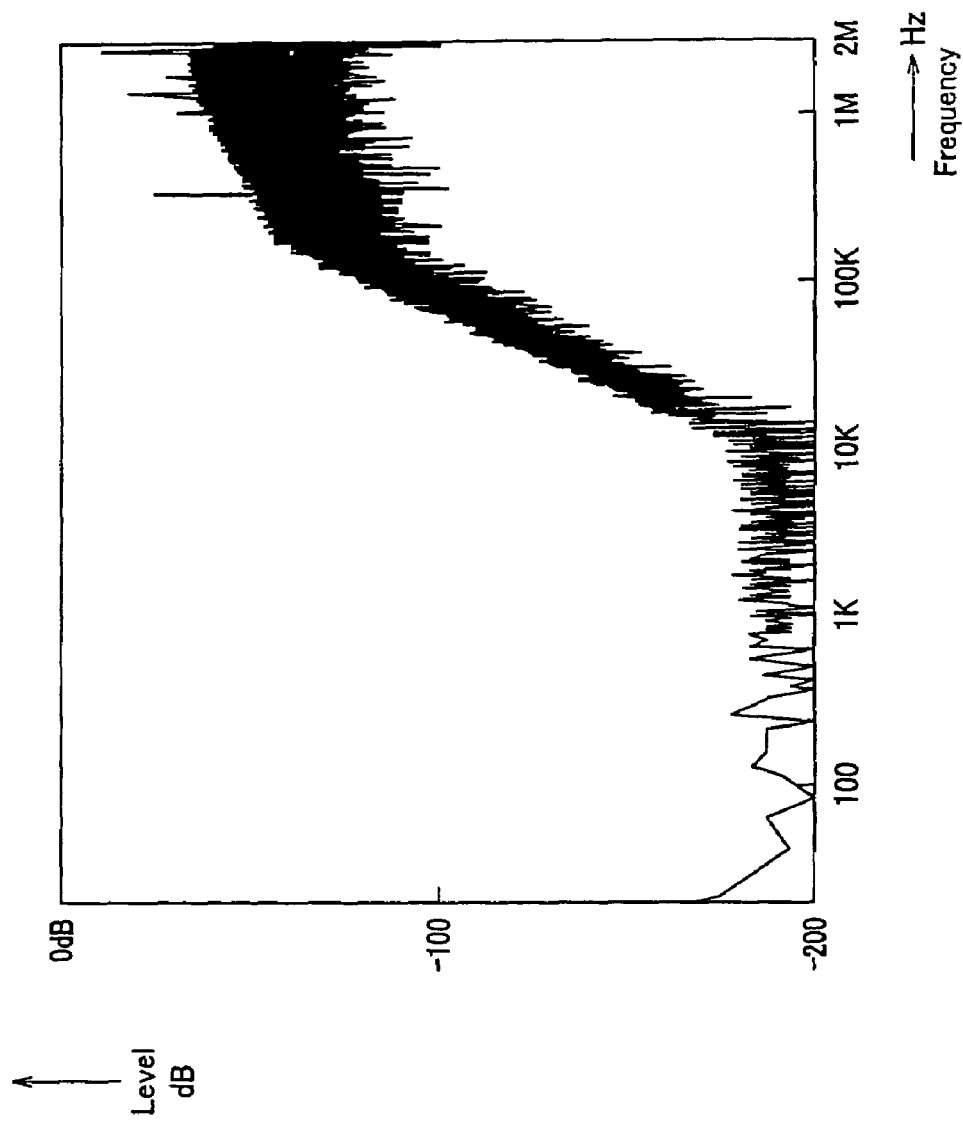
FIG. 14 is a spectrum diagram showing the frequency analysis result of an output signal with a sampling frequency of 128 fs (fs=44.1 kHz) and a data word length of 1-bit in the case where a signal of a fixed pattern is input.

The ΔΣ modulator 10 inputs the random noise signal to the quantizer 30 when a fixed pattern like the mute pattern is input; whereas the ΔΣ modulator 10 does not input the random noise signal to the quantizer 30 during reproduction of an audio signal representing music or the like. FIG. 14 is a spectrum diagram showing the frequency analysis result of an output signal with a sampling frequency of 128 fs (fs=44.1 kHz) and a data word length of 1-bit in the case where a signal of a fixed pattern is input. As can be seen from FIG. 14, it is possible to ensure a stable 1-bit signal having less distortion and to apply noise shaping normally.

Thus, during reproduction of an audio signal representing music or the like, the ΔΣ modulator 10 can ensure a stable 1-bit signal having less distortion at the transition time from an audio signal reproduction state to soundless state while maintaining high sound quality. Similarly, the ΔΣ modulator 10 can ensure high sound quality at the transition time from a soundless state to audio signal reproduction state.

Figure 15:
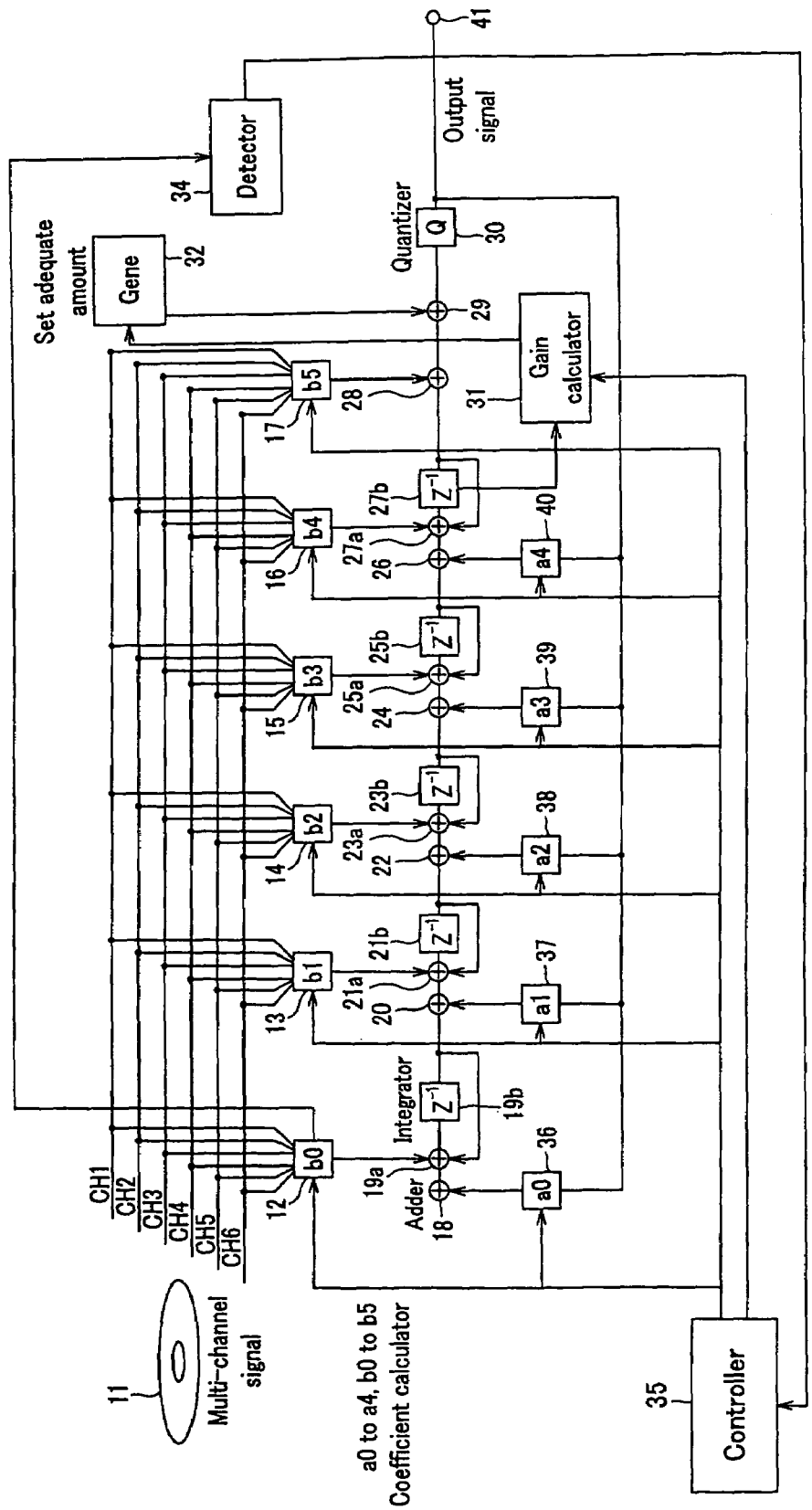
FIG. 15 is a configuration diagram of a ΔΣ modulator according to another embodiment.

Next, a fifth-order ΔΣ modulator 50 according to another embodiment of the present invention will be described with reference to FIG. 15. The configuration of the ΔΣ modulator 50 is substantially same as that of the ΔΣ modulator 10 shown in FIG. 6. A different point is that the detector 34 does not control the changeover of the changeover switch 33 but controls the gain of the gain calculator 31 through the controller 35. More concretely, when detecting the input 0 level or fixed level, the detector 34 supplies the controller 35 with a detection signal. The controller 35 then controls the gain of the gain calculator 31 in an equivalent manner to the dynamic control of the variable threshold Δq for quantization to not more than 75 with respect to ±1.0 of the quantizer (shown in FIG. 5). While the detector 34 does not detect the input 0 level or fixed level, the controller 35 sets the gain of the gain calculator 31 to 0 so as not to allow the random noise generator 32 to generate random noise.

As described above, the ΔΣ modulator 50 inputs the random noise signal to the quantizer 30 when the gain is set to 0 level during reproduction of an audio signal representing music or the like; whereas the ΔΣ modulator 50 does not input the random noise signal to the quantizer 30 during reproduction of an audio signal representing music or the like.

Further, the ΔΣ modulator 10 inputs the random noise signal to the quantizer 30 when a fixed pattern like the mute pattern is input; whereas the ΔΣ modulator 10 does not input the random noise signal to the quantizer 30 during reproduction of an audio signal representing music or the like.

Thus, during reproduction of an audio signal representing music or the like, the ΔΣ modulator 50 can ensure a stable 1-bit signal having less distortion at the transition time from an audio signal reproduction state to soundless state while maintaining high sound quality.

Similarly, the ΔΣ modulator 50 can ensure high sound quality at the transition time from a soundless state to audio signal reproduction state.

The audio signal used in the present invention may include that representing music, as well as every sound, such as natural sound, voice, artificial sound or the like.

The present invention contains subject matter related to Japanese Patent Applications JP 2004-186926 and JP 2005-167317 filed in Japanese Patent Office on Jun. 24, 2004 and Jun. 7, 2005, respectively, the entire contents of which being incorporated herein by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A delta-sigma modulator which applies delta-sigma modulation to an input signal to output a 1-bit digital signal, comprising:

integration means for applying integration to the input signal;

quantization means for quantizing the integrated output from the integration means;

random noise generation means for generating a random noise signal whose gain has been adjusted based on the integrated output of the integration means;

detection means for detecting a predetermined pattern from the input signal;

changeover means for switching supply and suspension of supply of the random noise signal from the random noise generation means to the quantization means based on a detection result of the detection means; and coefficient calculation means for performing calculation control for the input signal using a calculation coefficient, wherein the detection means detects the predetermined pattern from a calculated output of the coefficient calculation means.

2. The delta-sigma modulator according to claim 1, wherein the changeover means supplies the random noise signal generated by the random noise generation means to the quantization means when the detection means detects the predetermined pattern; whereas the changeover means suspends the supply when the detection means does not detect the predetermined pattern.

3. The delta-sigma modulator according to claim 1, wherein the detection means detects a fixed pattern representing a mute pattern and 0 level that continues for a predetermined time period as the predetermined pattern.

4. The delta-sigma modulator according to claim 1, wherein the random noise signal, which is supplied to the quantization means through the changeover means by the random noise generation means, is adjusted in an equivalent manner to variable control of the threshold level referred to in the quantization performed by the quantization means with respect to time axis and supplied to the quantization means.

5. The delta-sigma modulator according to claim 1 wherein the integration means is constituted by plural stages of cascade-connected integrators, and the quantization means applies quantization to the integrated output of the last stage integrator connected immediately next to the quantization means.

6. The delta-sigma modulator according to claim 5 wherein the integration means is constituted by m (m is a natural number not less than 2) stages of cascade-connected integrators, and the coefficient calculation means is constituted by m+1 coefficient calculators, wherein the detection means detects the predetermined pattern from the calculated output of one of the coefficient calculators.

7. A delta-sigma modulator which applies delta-sigma modulation to an input signal to output a 1-bit digital signal, comprising:

integration means for applying integration to the input signal;

quantization means for quantizing the integrated output from the integration means;

detection means for detecting a predetermined pattern from the input signal;

control means for controlling a threshold value for the quantization performed by the quantization means based on a detection result of the detection means; and coefficient calculation means for performing calculation control for the input signal using a calculation coefficient, wherein the detection means detects the predetermined pattern from a calculated output of the coefficient calculation means.

8. The delta-sigma modulator according to claim 7, further comprising random noise generation means for generating a random noise signal whose gain has been adjusted based on the integrated output of the integration means, wherein
the control means controls the gain to be supplied to the random noise generation means in an equivalent manner to variable control of the threshold level referred to in the quantization performed by the quantization means with respect to time axis when the detection means detects the predetermined pattern; whereas the control means sets the gain to 0 when the detection means does not detect the predetermined pattern.

9. The delta-sigma modulator according to claim 7, wherein the detection means detects a fixed pattern representing a mute pattern and 0 level that continues for a predetermined time period as the predetermined pattern.

10. The delta-sigma modulator according to claim 7 wherein
the integration means is constituted by plural stages of cascade-connected integrators, and
the quantization means applies quantization to the integrated output of the last stage integrator connected immediately next to the quantization means.

11. The delta-sigma modulator according to claim 10 wherein
the integration means is constituted by m (m is a natural number not less than 2) stages of cascade-connected integrators, and the coefficient calculation means is constituted by m+1 coefficient calculators, wherein
the detection means detects the predetermined pattern from the calculated output of one of the coefficient calculators.

12. A delta-sigma modulation method which applies delta-sigma modulation to an input signal to output a 1-bit digital signal, comprising:
an integration step of applying integration to the input signal;
a quantization step of quantizing the integrated output from the integration step;
a random noise generation step of generating a random noise signal whose gain has been adjusted based on the integrated output of the integration step;
a detection step of detecting a predetermined pattern from the input signal;
a changeover step of switching supply and suspension of supply of the random noise signal from the random noise generation step to the quantization step based on a detection result of the detection step; and
a coefficient calculation step of calculating control for the input signal using a calculation coefficient, wherein
the detection step detects the predetermined pattern from a calculated output of the coefficient calculation step.

13. The delta-sigma modulation method according to claim 12, wherein the changeover step supplies the random noise signal generated by the random noise generation step to the quantization step when the detection step detects the predetermined pattern; whereas the changeover step suspends the supply when the detection step does not detect the predetermined pattern.

14. The delta-sigma modulation method according to claim 12, wherein the detection step detects a fixed pattern representing a mute pattern and 0 level that continues for a predetermined time period as the predetermined pattern.

15. The delta-sigma modulation method according to claim 12, wherein the random noise signal, which is supplied to the quantization step through the changeover step by the random noise generation step, is adjusted in an equivalent manner to variable control of the threshold level referred to in the quantization performed in the quantization step with respect to time axis and supplied to the quantization step.

16. A delta-sigma modulator which applies delta-sigma modulation to an input signal to output a 1-bit digital signal, comprising:
an integration section that applies integration to the input signal;
a quantization section that quantizes the integrated output from the integration section;
a random noise generation section that generates a random noise signal whose gain has been adjusted based on the integrated output of the integration section;
a detection section that detects a predetermined pattern from the input signal;
a changeover section that switches supply and suspension of supply of the random noise signal from the random noise generation section to the quantization section based on a detection result of the detection section; and
a coefficient calculation section configured to perform calculation control for the input signal using a calculation coefficient, wherein
the detection section detects the predetermined pattern from a calculated output of the coefficient calculation section.

17. A delta-sigma modulator which applies delta-sigma modulation to an input signal to output a 1-bit digital signal, comprising:
an integration section that applies integration to the input signal;
a quantization section that quantizes the integrated output from the integration section;
a detection section that detects a predetermined pattern from the input signal;
a control section that controls a threshold value for the quantization performed by the quantization section based on a detection result of the detection section; and
a coefficient calculation section configured to perform calculation control for the input signal using a calculation coefficient, wherein
the detection section detects the predetermined pattern from a calculated output of the coefficient calculation section.

* * * * *